United States Patent
Swanson et al.

[11] Patent Number: 5,903,188
[45] Date of Patent: May 11, 1999

[54] MODULATOR HAVING IMPROVED DISCHARGING UNWANTED CAPACITANCE

[75] Inventors: Hilmer Irvin Swanson; Gerald Wayne Collins, both of Quincy, Ill.

[73] Assignee: Harris Corporation, Melbourne, Fla.

[21] Appl. No.: 09/025,046

[22] Filed: Feb. 17, 1998

[51] Int. Cl.$^6$ .................................................. H03F 3/38
[52] U.S. Cl. .......................... 330/10; 330/251; 332/149
[58] Field of Search ........................ 330/10, 202, 207 A, 330/251, 297, 292; 332/149; 455/108

[56] References Cited

U.S. PATENT DOCUMENTS

| | | | |
|---|---|---|---|
| 4,047,120 | 9/1977 | Lord et al. | 330/207 P |
| 4,403,197 | 9/1983 | Swanson . | |
| 4,560,944 | 12/1985 | Furrer . | |
| 5,111,373 | 5/1992 | Higaki | 363/37 |
| 5,309,114 | 5/1994 | Swanson | 330/10 |
| 5,381,109 | 1/1995 | Cripe et al. | 330/10 |
| 5,392,007 | 2/1995 | Cripe | 332/149 |

*Primary Examiner*—Robert Pascal
*Assistant Examiner*—Henry Choe
*Attorney, Agent, or Firm*—Tarolli, Sundheim, Covell, Tummino & Szabo

[57] ABSTRACT

A pulse step modulator comprising is disclosed including a plurality of series connected unit step modules, each including a DC voltage source and an associated actuatable switch for, when on, turning on the associated module to provide a unit step voltage. An output circuit is connected to the series connected modules for providing an output voltage to a load wherein the magnitude of the output voltage is equal to the sum of all the voltage sources of the modules that are turned on. A plurality of module turn on signals are provided, each for turning on a switch in one of the modules for the time duration of the turn on signal after which the switch is turned off. Each unit step module includes a transformer means exhibiting an associated unwanted capacitance between transformer means and circuit ground and which capacitance becomes charged when the associated switch is turned on. Each unit step module has capacitance discharge means for rapidly discharging the associated capacitance each time the associated switch is turned off.

9 Claims, 4 Drawing Sheets

MODULATOR HAVING IMPROVED DISCHARGING UNWANTED CAPACITANCE

FIELD OF THE INVENTION

The present invention is directed to the art of modulators and, more particularly, to pulse step modulators which are particularly applicable for use in radio and television broadcasting systems.

DESCRIPTION OF THE PRIOR ART

In AM radio broadcasting in the medium-wave and short-wave bands, a high-power vacuum tube is conventionally used in the final radio frequency amplifier stage of the transmitter. For maximum power-amplification efficiency, this tube is not operated as a linear amplifier, but rather as a class C or class D biased circuit, producing an RF envelope which follows that of the B+ DC supply voltage provided to the tube anode. Thus, modulation of the RF signal is achieved through varying the B+ DC supply to the plate anode of the tube. The high-powered audio amplification circuitry required to vary this voltage is referred to in the art as the modulator.

Recently, a modulator to achieve the foregoing has been employed in the art and is known as a pulse step modulator (PSM). Such a pulse step modulator is disclosed in U.S. Pat. No. 4,403,197 to H. I. Swanson. Briefly, a pulse step modulator (PSM) as disclosed in that patent includes a plurality of series connected unit step modules each of which includes an isolated DC voltage source, a remotely controlled switch and a series diode. The switch in each module may be remotely controlled to turn the module on or off. As each module is turned on, it provides a step voltage. As the various modules are turned on in a stepwise fashion, the output voltage will increase in steps from 0 volts to a maximum voltage with the maximum equaling the sum of all of the module DC voltage sources. A lowpass filter at the output may be employed for removing switching noise. An encoder or the like monitors a time varying input signal, such as an audio signal, and turns on one of the unit step modules for each incremental increase in the value of the audio signal. As the audio signal continues to increase in value, the modules are turned on one at a time in a given order. Similarly, as the audio signal decreases in value, the modules are sequentially turned off in the reverse order.

The U.S. Pat. No. to A. Furrer 4,560,944 also discloses a pulse step modulator similar to that as described above.

Such prior art pulse step modulators typically include within the isolated DC voltage source a transformer means coupled to an AC power supply. The transformer means is connected to a rectifier that provides the DC voltage or step voltage for the module. There is unwanted or stray capacitance between the transformer means and circuit ground. This capacitance limits the switching frequency of the remotely controlled switch in the pulse step modulator. The switch in each unit step module is remotely controlled to turn the module on or off. Each time the module is turned on, it provides a step voltage. When the module is turned on the capacitance charges. When the module is turned off the capacitance discharges by way of the load. The discharge RC time constant is fixed by the magnitude of the capacitance and the magnitude of the load. At high switching frequencies, the unwanted capacitance becomes a problem because it limits the system frequency. Thus, the switching time may become so fast that the capacitance cannot properly discharge.

The prior art pulse step modulators have typically been employed in AM radio broadcasting applications. It has been proposed to employ such modulators for modulating the video signal in a TV broadcasting system. This requires a higher operating frequency. For example, a typical audio frequency application may have an operating frequency of 10 KHz whereas the symbol rate proposed for high definition television (HDTV) broadcasting may well be on the order of 10.76 MHz. This is approximately 1,000 times that of the audio frequency. Such a high operating frequency will increase the problems associated with unwanted or stray capacitance and the difficulty of discharging such capacitance during the switch OFF time. This may result in video picture distortion.

SUMMARY OF THE INVENTION

It is an object of the present invention to provide an improved pulse step modulator having means for discharging the unwanted or stray capacitance in each module of a pulse step modulator during the module OFF time.

In accordance with the invention, an improved pulse step modulator includes a plurality of series connected unit step modules, each including a DC voltage source and an associated actuatable switching means for, when ON, turning on the associated module to provide a unit step voltage. An output circuit is connected to the series connected modules for providing an output voltage to a load wherein the magnitude of the output voltage is equal to the sum of all the voltage sources of the modules that are turned on. A plurality of turn on signals are provided with each serving to actuate one of the switches in one of the modules to thereby turn the associated module on. Upon removal of the on signal the switching means is turned off and the module is turned off. Each unit step module includes transformer means that exhibits an associated unwanted capacitance between the transformer means and circuit ground. This capacitance becomes charged when the associated switching means is turned on. Each module includes capacitance discharge means for rapidly discharging the associated capacitance each time the associated switching means is turned off.

BRIEF DESCRIPTION OF THE DRAWINGS

The foregoing and other features of the present invention will become more readily apparent from the following description as taken in conjunction with the accompanying drawings, wherein.

DESCRIPTION OF A PREFERRED EMBODIMENT

Figure 1:
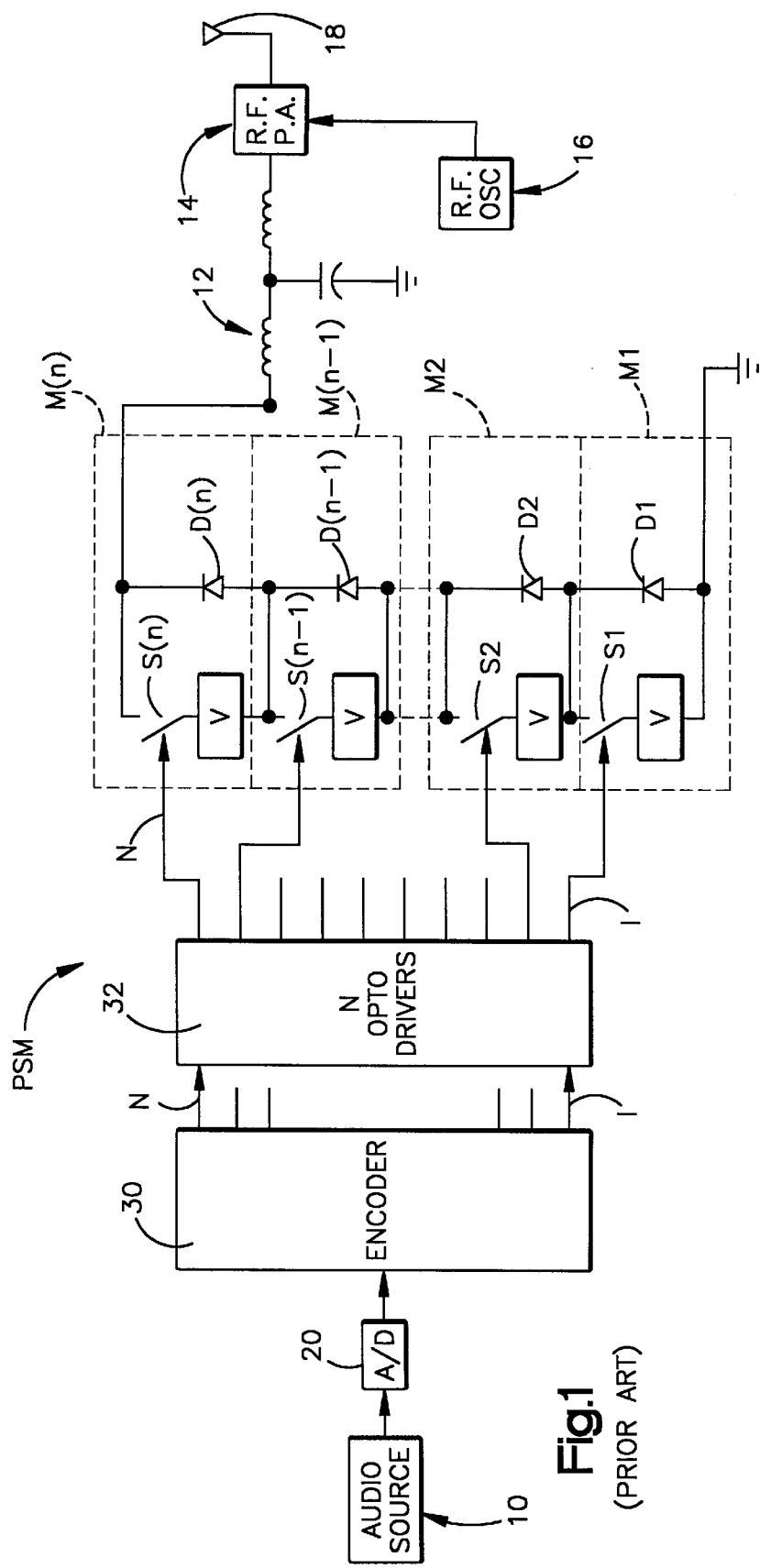
FIG. 1 is a schematic-block diagram illustration of a prior art AM broadcasting transmitter employing a pulse step modulator (PSM)

Reference is now made to the drawings wherein the showings are for purposes of illustrating a preferred embodiment of the invention only and not for purposes of limiting same. FIG. 1 illustrates an AM transmitter which incorporates a pulse step modulator (PSM). The transmitter includes an audio source 10 which generates an amplitude and frequency varying audio signal which is to be amplified and transmitted. This signal is supplied by way of a conventional analog-to-digital converter 20 to a pulse step modulator (PSM). The pulse step modulator, to be described in greater detail hereinafter, amplifies the signal to a high power level and provides a resulting amplitude signal to a low pass filter 12. The resulting amplified and filtered signal is then supplied to the audio input of a conventional RF power amplifier 14 where it amplitude modulates an RF carrier signal supplied by an RF oscillator 16. The resulting AM signal is then transmitted by a conventional antenna 18.

The analog-to-digital converter 20 receives the analog audio signal from the audio source 10 and converts it into a multi-bit digital representation thereof. For example, the analog input signal may be converted into a 12 bit digital signal. The six most significant bits (6 MSB) are supplied to a encoder 30 having N output circuits which are supplied to an optical driver circuit 32. Circuit 32 has N output circuits respectively connected to N unit step switches S1 through SN. Switches S1 through SN are respectively located in unit step modules M1 through M(N).

The encoder 30 sequentially energizes its output circuits 1 through N with incremental increases in the magnitude of the analog signal and de-energizes the output circuits in the reverse order with incremental decreases in the magnitude of the analog signal. These are reflected through the optical driver circuit 32. The optical driver circuit has output circuits 1 through N which serve to sequentially close switches S1 through SN as the analog input signal incrementally increases in magnitude and to sequentially open the switches, in the reverse order, as the input analog signal incrementally decreases in magnitude. Whenever a switch S1 through SN is open, the associated unit step module is turned off and whenever a switch is closed, the associated unit step module is turned on.

Each unit step module M1 through M(N) includes an incremental unit step voltage source V, a switch such as switch S1 and a diode such as diode D1 all interconnected as shown with respect to module M1 in FIG. 1. The unit step modules are connected together in series with diodes D1 through D(N). Each incremental voltage source may be considered as a DC voltage source of a fixed magnitude which, in practice, may be on the order of 600 volts. The total voltage across the series connected modules is dependent upon the number of modules which have been turned on by closure of the associated switches S1 through S(N). For example, if all of the switches S1 through SN are closed, then all of the unit step voltage sources V are connected together in series and added together to provide an output voltage NV. If each unit step voltage source V has a value on the order of 600 volts and N is on the order of 50, then the total voltage may be on the order of 30,000 volts.

Figure 2:
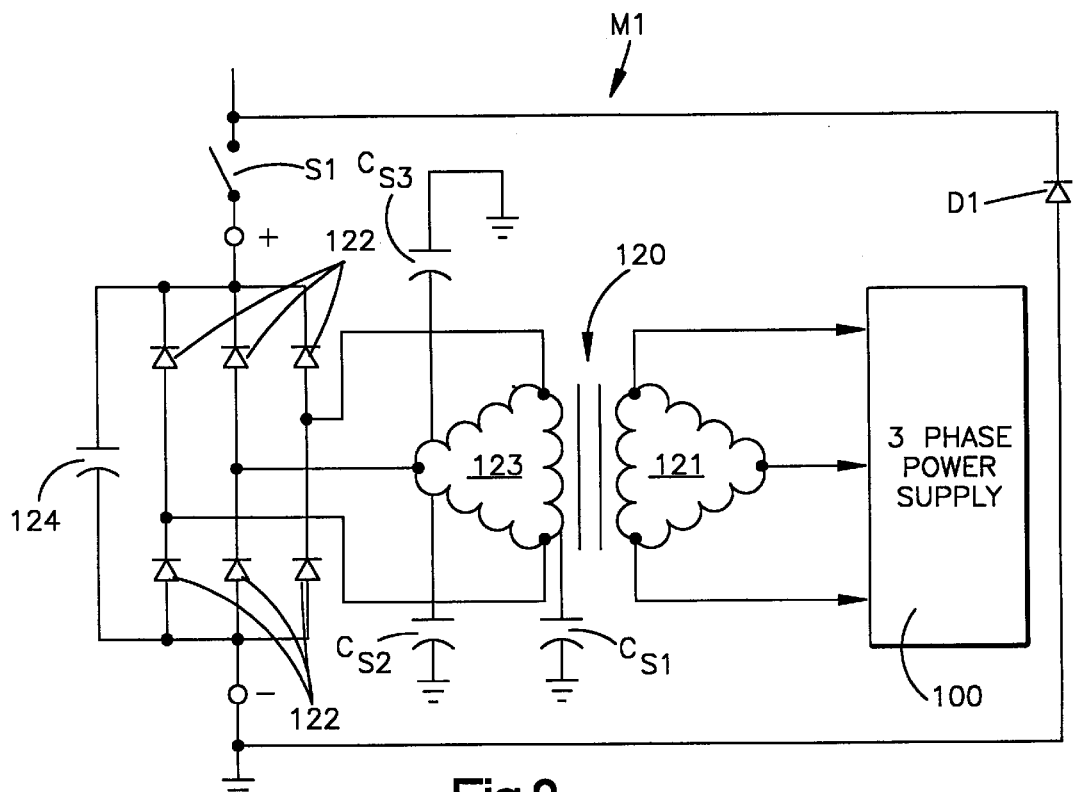
FIG. 2 is a schematic-block diagram illustration of a prior art unit step module employed in FIG. 1.

Reference is now made to FIG. 2 which illustrates one form that module M1 of FIG. 2 may take. In this form, the module includes in addition to diode D1 and switch S1, a DC voltage source which includes a 3-phase AC power supply 100, a transformer 120 having primary windings 121 and secondary windings 123 together with six (6) diodes 122 which form a conventional full wave 3-phase rectifying circuit and a filter capacitor 124. It is to be appreciated that whereas a 3-phase supply source and a 3-phase transformer have been illustrated the circuitry may take another form.

The present invention recognizes that a problem in the operation of pulse step modulators is unwanted or stray capacitance associated with the transformer means. The capacitance is from the secondary windings to circuit ground and defines the module to ground capacitance. This capacitance degrades the operation of the pulse modulator. It is to be noted that in a pulse step modulator such as that disclosed in FIG. 1, the load is the mechanism through which the charged capacitance is discharged. The discharge RC time constant is fixed by the magnitude of the unwanted or stray capacitance and that of the load. This limits the frequency of operation because increased switching frequency will cause the switching time to be so fast that the capacitance cannot properly discharge during the module OFF time. This is a particular problem in a substantially higher frequency application such as in digital television where the symbol rate may be on the order of 10.76 MHz.

Figure 3:
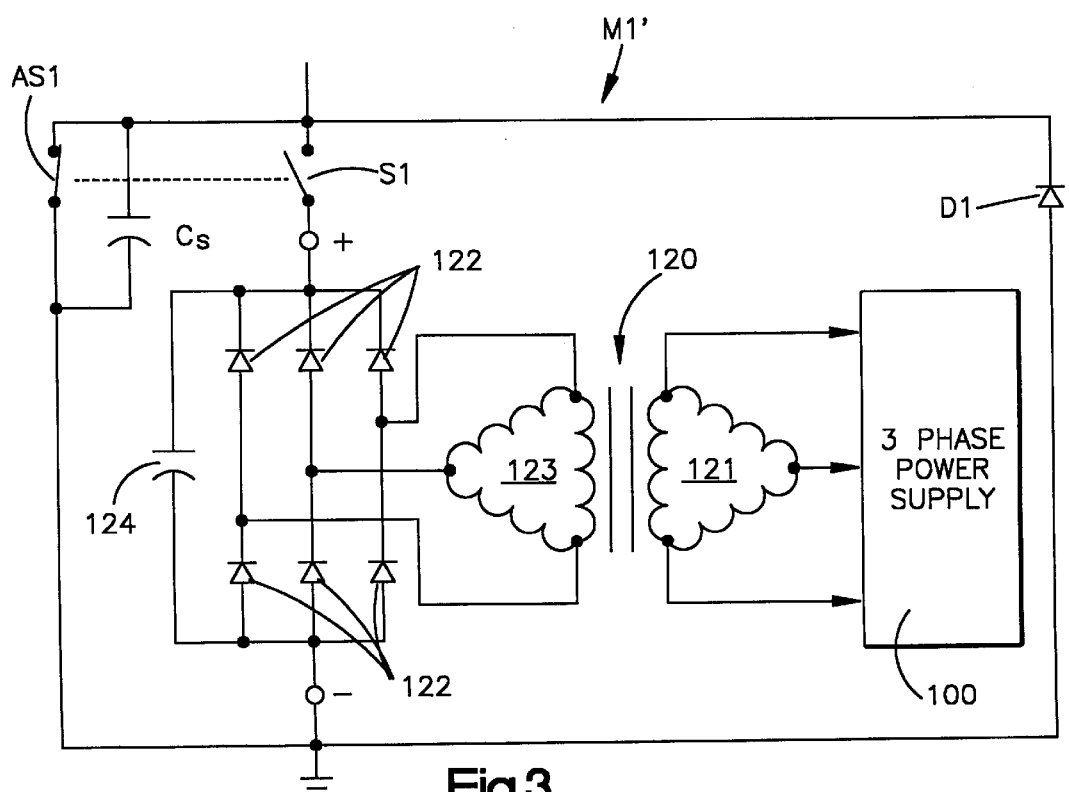
FIG. 3 is a schematic-block diagram illustration of an improved unit step module in accordance with the present invention.

The stray capacitance $C_s1$, $C_s2$, and $C_s3$ from the secondary windings of the transformer to ground, as well as other stray capacitance between the transformer and ground in FIG. 2 are all represented in FIG. 3 by a capacitor $C_s$ connected across the module M1 to ground. In accordance with the present invention an additional switch AS1 is connected across the output circuit of the module (across the capacitance $C_s$). This switch AS1 is operated so that whenever the module switch S1 is open to turn the module OFF the switch AS1 is closed to provide fast discharge of the capacitance $C_s$. As illustrated in FIG. 3, this may be achieved by providing a ganged switch arrangement so that as switch S1 closes, switch AS1 opens and vice versa.

Figure 4:
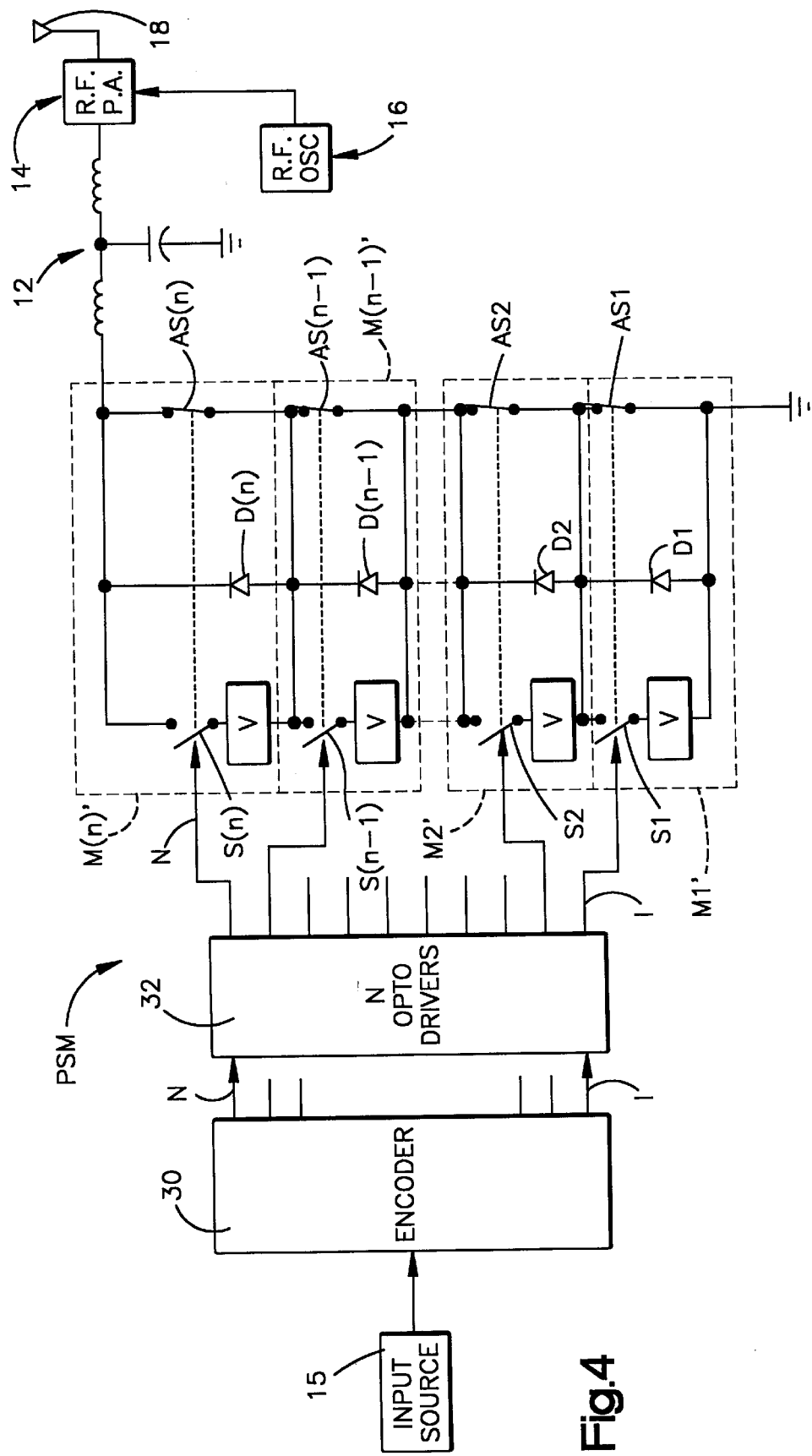
FIG. 4 is a schematic-block diagram illustration of a broadcasting transmitter employing a plurality of unit step modules with each corresponding to that shown in FIG. 3.

Reference is now made to FIG. 4 which illustrates a pulse step modulator (PSM) system employing the present invention and which is modeled after the module M1' shown in FIG. 3. In this embodiment, the input source 15 may include a low frequency source, such as audio source 10 of FIG. 1, followed by an analog to digital converter 20 so that the output of source 15 is a plurality of multi-bit digital words with each digital word being supplied to the encoder 30 as described with reference to FIG. 1. Alternatively, however, the input source 15 may be a digital source such as a stream of digital words obtained from a video source such as in a HDTV system. Each digital word in this stream of digital words is supplied to the encoder 30 in the manner as described hereinbefore.

In accordance with the present invention the modules M1' through M(n)' take the form as shown in FIG. 3 with respect to module M1'. Thus as shown in module M1' additional switch AS1 has been added and operates so that the additional switch AS1 is closed when the module switch S1 is open and vice versa. This provides a fast discharge circuit for discharging the unwanted or stray capacitance $C_s$ associated with the module. As shown in FIG. 4 the additional switches include switches AS1, AS2, AS(n—1) and AS(n).

Figure 5:
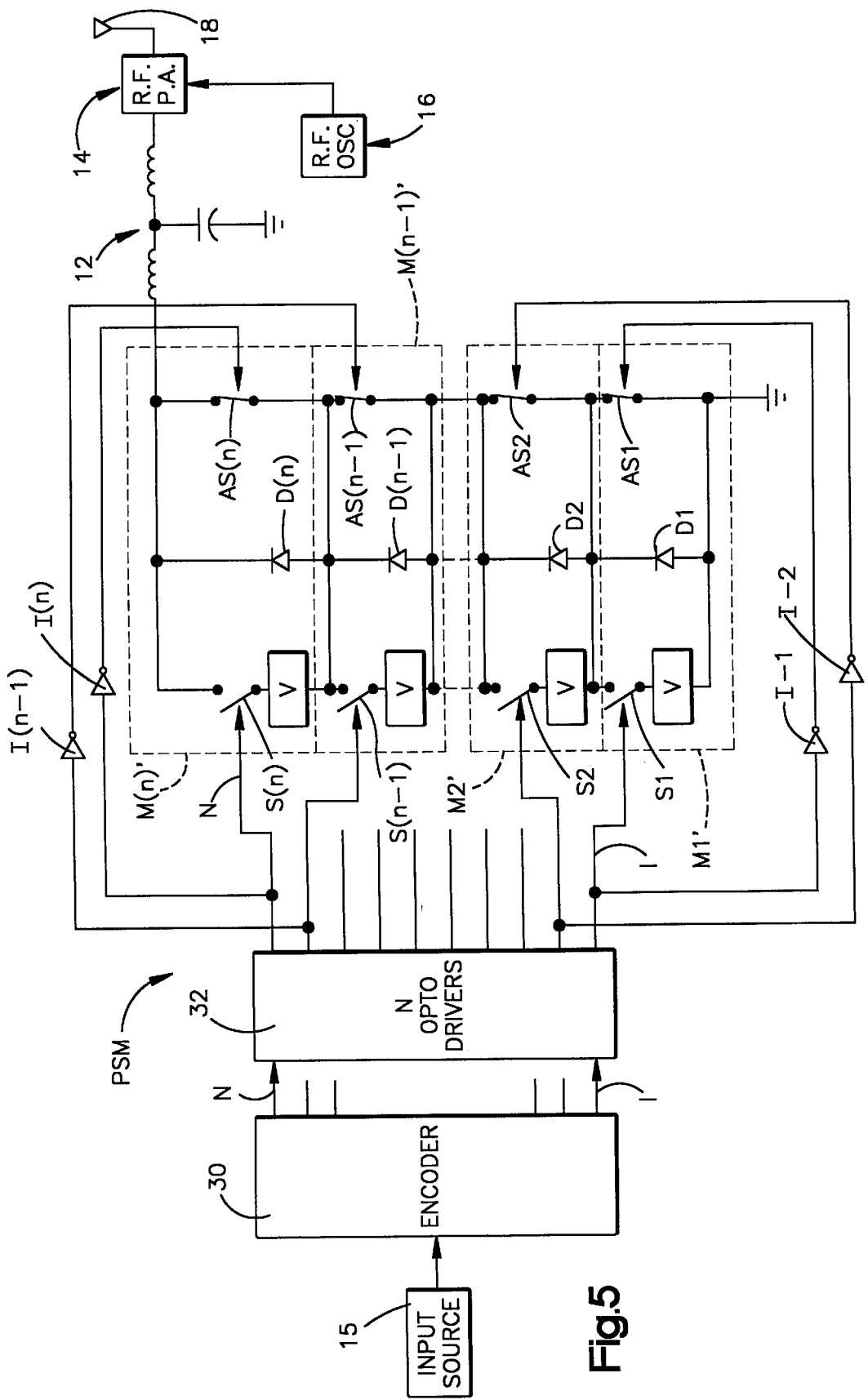
FIG. 5 is a schematic-block diagram illustration similar to that of FIG. 4 but showing a plurality of unit step modules in accordance with a second embodiment of the present invention.

Reference is now made to FIG. 5 that shows another embodiment of the invention similar to that of the embodiment in FIG. 4 and consequently, like components will be identified herein with like character references to simplify the description herein. In the embodiment of FIG. 5 each module switch and its associated additional switch are not ganged together as in FIG. 4 but are made to operate in the same manner by use of inverters. Thus the input signal to switch S1 is either a turn ON signal or a turn OFF signal. This signal is applied through an inverter I-1 which inverts the signal for controlling the additional switch AS1. In this manner when the command to switch S1 is a turn ON command, the command to the associated switch AS1 is a turn OFF command and vice versa. In a similar manner, module M2' in FIG. 5 is provided with an inverter I-2. Also module M(n—1)' is provided with an inverter I(n—1). Similarly, module M(n) is provided with an inverter I(n).

In the discussion given above, it is to appreciated that whereas the various switches are illustrated as being single pole, double throw switches they may take various forms such as electromechanical switches that are ganged together in a mechanical manner or they may be electronic switches, such as various semi-conductor devices.

Whereas the invention has been described in conjunction with particular embodiments, it is to be appreciated that various modifications will occur to those skilled in the art within the spirit and scope of the invention as defined by the appended claims.

Having described the invention, we claim:

1. A pulse step modulator comprising:

a plurality of series connected unit step modules, each including a DC voltage source and an associated actuatable first switching means for, when on, turning on said associated module to provide a unit step voltage;

an output circuit connected to said series connected modules for providing an output voltage to a load wherein the magnitude of the output voltage is equal to the sum of all the voltage sources of the modules that are turned on;

means for providing a plurality of module turn on signals, each for turning on a said first switching means in one of said modules for the time duration of said turn on signal after which said first switching means is turned off;

each said unit step module including transformer means exhibiting an associated unwanted capacitance between said transformer means and circuit ground and which capacitance becomes charged when the associated first switching means is turned on;

each said unit step module having capacitance discharge means for rapidly discharging said associated capacitance each time said associated first switching means is turned off.

2. A pulse step modulator as set forth in claim 1 wherein said transformer means includes a transformer secondary winding.

3. A pulse step modulator as set forth in claim 2 wherein each said module includes a transformer having a primary winding and said transformer secondary winding.

4. A pulse step modulator as set forth in claim 2 wherein said capacitance discharge means in each said module includes a second switching means.

5. A pulse step modulator as set forth in claim 4 wherein said second switching means is connected in parallel with said capacitance means so that when said second switching means is ON said capacitance means discharges through said second switching means.

6. A pulse step modulator as set forth in claim 5 including control means for turning said first switching means ON while turning said second switching means OFF and vice versa.

7. A pulse step modulator as set forth in claim 6 wherein said control means includes means for interconnecting said first and second switching means in each said module.

8. A pulse step modulator as set forth in claim 6 wherein said control means includes means responsive to a turn ON signal for turning said second switching means OFF and being responsive to the absence of a said turn ON signal for turning said second switching means ON.

9. A pulse step modulator as set forth in claim 8 wherein said control means includes signal inverter means.

\* \* \* \* \*